United States Patent
Su et al.

(10) Patent No.: US 10,754,094 B2
(45) Date of Patent: Aug. 25, 2020

(54) METHOD FOR OPTICAL WAVEGUIDE FABRICATION

(71) Applicants: Dow Global Technologies LLC, Midland, MI (US); Dow Silicones Corporation, Midland, MI (US)

(72) Inventors: Kai Su, Midland, MI (US); Brandon W. Swatowski, Sanford, MI (US)

(73) Assignees: Dow Global Technologies LLC, Midland, MI (US); Dow Silicones Corporation, Midland, MI (US)

( * ) Notice: Subject to any disclaimer, the term of this patent is extended or adjusted under 35 U.S.C. 154(b) by 0 days.

(21) Appl. No.: 16/623,551

(22) PCT Filed: Jul. 9, 2018

(86) PCT No.: PCT/US2018/041250
§ 371 (c)(1),
(2) Date: Dec. 17, 2019

(87) PCT Pub. No.: WO2019/040193
PCT Pub. Date: Feb. 28, 2019

(65) Prior Publication Data
US 2020/0174190 A1  Jun. 4, 2020

Related U.S. Application Data

(60) Provisional application No. 62/549,647, filed on Aug. 24, 2017.

(51) Int. Cl.
| | |
|---|---|
| G02B 6/122 | (2006.01) |
| G02B 1/04 | (2006.01) |
| G02B 6/138 | (2006.01) |
| G03F 7/038 | (2006.01) |
| G02B 6/12 | (2006.01) |

(52) U.S. Cl.
CPC .......... *G02B 6/1221* (2013.01); *G02B 1/046* (2013.01); *G02B 6/138* (2013.01); *G03F 7/038* (2013.01); *G02B 2006/1219* (2013.01)

(58) Field of Classification Search
None
See application file for complete search history.

(56) References Cited

U.S. PATENT DOCUMENTS

| | | | |
|---|---|---|---|
| 8,175,439 | B2 | 5/2012 | Fujiue et al. |
| 2004/0076391 | A1 | 4/2004 | Ghoshal et al. |
| 2008/0032061 | A1 | 2/2008 | Watanabe et al. |

FOREIGN PATENT DOCUMENTS

| | | |
|---|---|---|
| EP | 1142928 | 10/2001 |
| WO | 2008027280 | 3/2008 |
| WO | 2019040191 | 2/2019 |
| WO | 2019040192 | 2/2019 |

OTHER PUBLICATIONS

Soma, et al., Fabrication of a Graded-Index Circular-Core Polymer Parallel Optical Waveguide Using a Microdispenser for a High-Density Optical Printed Curcuit Board, IEEE Journal of Selected Topics in Quantum Electronics, vol. 19, No. 2, Mar./Apr. 2013.
Kinoshita, et al., Polymer Optical Waveguides With GI and W-Shaped Cores for High-Bandwidth-Density On-Board Interconnects, Journal of Lightwave Technology, vol. 31, No. 24, Dec. 15, 2011.
Mori, et al., Optical and electrical hybrid flexible printed curcuit boards with unique photo-defined polymer waveguide layers, Invited Paper, Sumitomo Bakelite Co., Ltd., COIN project team, Japan, Proc of SPIE vol. 7607 76078OS-1 to 7907OS-11, May 1, 2017.

*Primary Examiner* — Jerry Rahll
(74) *Attorney, Agent, or Firm* — Steven W. Monk

(57) ABSTRACT

A method for producing an optical waveguide by: (a) depositing on a substrate a composition comprising: (i) a poly-siloxane comprising epoxy groups and alkenyl groups, (ii) a silane crosslinker having at least two silicon-hydrogen bonds and (iii) at least one compound comprising an epoxy group and a refractive index of at least 1.49; (b) heating; (c) depositing a second composition comprising: (i) a second polysiloxane comprising epoxy groups and alkenyl groups, and (ii) a second silane crosslinker having at least two silicon-hydrogen bonds; (d) curing by heating; (e) exposing to ultraviolet light through a mask to produce a patterned core layer; (f) heating to evaporate at least a part of the uncured portion of the first composition.

10 Claims, No Drawings

METHOD FOR OPTICAL WAVEGUIDE FABRICATION

This invention relates to a method for optical waveguide fabrication capable of producing optical waveguides without the need for solvent development.

Waveguides having core and clad structures, in which the core has a higher refractive index, are typically fabricated by using photosensitive compositions and a photolithographic process. The process comprises treatment with solvents to develop patterned core structures.

The problem solved by this invention is the need for new methods to produce optical waveguides without the need for solvent development.

STATEMENT OF THE INVENTION

The present invention provides a method for producing a dry film optical waveguide; said method comprising steps of: (a) depositing on a substrate a first composition comprising: (i) a first polysiloxane comprising epoxy groups and alkenyl groups, (ii) a first silane crosslinker comprising at least two silicon-hydrogen bonds, (iii) at least one first compound comprising an epoxy group, having molecular weight no greater than 1000 and a refractive index at least 0.002 higher than a weight average refractive index of the first polysiloxane and the first silane crosslinker, (iv) at least one hydrosilylation catalyst, (v) at least one inhibitor for hydrosilylation, and (vi) at least one photo acid generator; (b) heating to produce a cured first composition; (c) depositing on the cured first composition a second composition comprising: (i) a second polysiloxane comprising epoxy groups and alkenyl groups, (ii) a second silane crosslinker comprising at least two silicon-hydrogen bonds, (iii) at least one hydrosilylation catalyst, and (iv) at least one inhibitor for hydrosilylation, to produce a composite; (d) curing the second composition by heating to produce a composite; (e) exposing the composite to ultraviolet light through a mask to produce a patterned core layer comprising a cured portion of the first composition and an uncured portion of the first composition; (f) heating to evaporate at least a part of the uncured portion of the first composition to produce a final patterned core layer.

DETAILED DESCRIPTION

Percentages are weight percentages (wt %) and temperatures are in ° C. unless specified otherwise. Operations were performed at room temperature unless specified otherwise. Alkyl groups are saturated hydrocarbyl groups that may be straight or branched. Preferably, alkyl groups have from one to twelve carbon atoms. Preferably, alkyl groups are unsubstituted. Aryl groups are substituent groups derived from aromatic hydrocarbon compounds which can be mono- or poly-nuclear. Aryl groups may be substituted by $C_1$-$C_4$ alkyl and/or $C_1$-$C_4$ alkoxy groups. Preferably, aryl groups are unsubstituted.

As used herein, unless otherwise indicated, molecular weights, $M_n$, $M_w$ and $M_z$ have the conventional meanings and are determined by gel permeation chromatography. Molecular weights are reported herein in units of g/mol. Refractive indices are measured at 25° C. at the sodium D-line (589 nm).

In a preferred embodiment of the invention, the substrate comprises a non-reactive material coated with a lower clad layer having a refractive index at least 0.002 lower than the refractive index of the film made from the core material. Preferably, the non-reactive material is silicon, glass, polyimide or FR4 board (FR4 is a glass fiber epoxy laminate). Preferably, the non-reactive material is substantially planar, e.g., wafer, board, disk or film. Preferably, the lower clad layer is a cured film derived from a composition that comprises: (i) a polysiloxane comprising epoxy groups and alkenyl groups; (ii) a silane crosslinker having at least two silicon-hydrogen bonds, (iii) at least one hydrosilylation catalyst, and (iv) at least one inhibitor for hydrosilylation. Preferably, the polysiloxane comprises from 4 to 25 mole % (preferably 6 to 22 mole %, preferably 8 to 20 mole %, preferably 10 to 19 mole %) of a unit having formula $R^1R^2R^3SiO_{1/2}$, wherein $R^1$ and $R^2$ independently are $C_1$-$C_{12}$ alkyl, preferably $C_1$-$C_6$ alkyl, preferably $C_1$-$C_4$ alkyl, preferably methyl or ethyl, preferably methyl; and $R^3$ is $C_2$-$C_{12}$ alkenyl, preferably $C_2$-$C_6$ alkenyl, preferably $C_2$-$C_4$ alkenyl, preferably vinyl. Preferably, the polysiloxane comprises from 20 to 50 mole % (preferably 24 to 44 mole %, preferably 26 to 42 mole %, preferably 28 to 40 mole %) of a unit having formula $EpSiO_{3/2}$, wherein Ep is $C_3$-$C_{20}$ alkyl substituted with an epoxy group, preferably $C_4$-$C_{15}$ alkyl substituted with an epoxy group, preferably $C_5$-$C_{10}$ alkyl substituted with an epoxy group, preferably $C_5$-$C_{10}$ alkyl comprising cyclohexyl fused to an ethylene oxide ring, preferably 2-(3,4-epoxycyclohexyl)ethyl. Preferably, the polysiloxane comprises from 35 to 65 mole % (preferably 38 to 62 mole %, preferably 41 to 59 mole %, preferably 44 to 57 mole %) of a unit having formula $R^4SiO_{3/2}$, wherein $R^4$ is $C_1$-$C_{18}$ alkyl, preferably $C_2$-$C_{12}$ alkyl, preferably $C_3$-$C_{10}$ alkyl, preferably $C_4$-$C_8$ alkyl, preferably hexyl. Preferably, the silane crosslinker has at least three silicon-hydrogen bonds (preferably 4) and a molecular weight from 200 to 5000, preferably 250 to 2000, preferably 300 to 1000, preferably 300 to 500. Preferably, the four silicon-hydrogen bonds connect to four different silicon atoms. Preferably, the silane crosslinker has formula $Si(OSiR_2H)_4$, where R is $C_1$-$C_6$ alkyl, preferably $C_1$-$C_4$ alkyl, preferably methyl or ethyl, preferably methyl.

Preferably, the lower clad layer comprises from 70 to 99 wt % of polysiloxane(s) comprising epoxy groups and alkenyl groups, preferably at least 80 wt %, preferably at least 85 wt %, preferably at least 90 wt %; preferably no more than 97 wt %, preferably no more than 96 wt %, preferably no more than 95 wt %. Preferably, the lower clad layer comprises from 1 to 30 wt % of silane crosslinker(s), preferably at least 3 wt %, preferably at least 5 wt %; preferably no more than 20 wt %, preferably no more than 15 wt %, preferably no more than 10 wt %. Preferably, the lower clad layer is cured by heating.

The first composition comprises: (i) a first polysiloxane comprising epoxy groups and alkenyl groups, (ii) a first silane crosslinker comprising at least two silicon-hydrogen bonds, (iii) at least one first compound comprising an epoxy group, having molecular weight no greater than 1000 and a refractive index at least 0.002 higher than a weight average refractive index of the first polysiloxane and the first silane crosslinker, (iv) at least one hydrosilylation catalyst, (v) at least one inhibitor for hydrosilylation, and (vi) at least one photo acid generator. Preferably, the first polysiloxane comprising epoxy groups and alkenyl groups comprises from 4 to 25 mole % (preferably 6 to 22 mole %, preferably 8 to 20 mole %, preferably 10 to 19 mole %) of a unit having formula $R^5R^6R^7SiO_{1/2}$, wherein $R^5$ and $R^6$ independently are $C_1$-$C_{12}$ alkyl, preferably $C_1$-$C_6$ alkyl, preferably $C_1$-$C_4$ alkyl, preferably methyl or ethyl, preferably methyl; and $R^7$ is $C_2$-$C_{12}$ alkenyl, preferably $C_2$-$C_6$ alkenyl, preferably $C_2$-$C_4$ alkenyl, preferably vinyl. Preferably, the first polysiloxane comprises from 20 to 50 mole % (preferably 24 to 44 mole %, preferably 26 to 42 mole %, preferably 28 to 40 mole %) of a unit having formula $Ep^1SiO_{3/2}$, wherein $Ep^1$ is $C_3$-$C_{20}$ alkyl substituted with an epoxy group, preferably $C_4$-$C_{15}$ alkyl substituted with an epoxy group, preferably $C_5$-$C_{10}$ alkyl substituted with an epoxy group, preferably $C_5$-$C_{10}$ alkyl comprising cyclohexyl fused to an ethylene oxide ring, preferably 2-(3,4-epoxycyclohexyl)ethyl. Preferably, the first polysiloxane comprises from 35 to 65 mole % (preferably 38 to 62 mole %, preferably 41 to 59 mole %, preferably 44 to 57 mole %) of a unit having formula $R^8SiO_{3/2}$, wherein $R^8$ is $C_1$-$C_{18}$ alkyl, preferably $C_2$-$C_{12}$ alkyl, preferably $C_3$-$C_{10}$ alkyl, preferably $C_4$-$C_8$ alkyl, preferably hexyl. Preferably, the first silane crosslinker has three silicon-hydrogen bonds (preferably 4) and a molecular weight from 200 to 1000, preferably 300 to 600, preferably 300 to 500. Preferably, the silicon-hydrogen bonds connect to different silicon atoms. Preferably, the first silane crosslinker has formula $Si(OSiR_2H)_4$, where R is $C_1$-$C_6$ alkyl, preferably $C_1$-$C_4$ alkyl, preferably methyl or ethyl, preferably methyl. Preferably, the first compound comprising an epoxy group, having molecular weight no greater than 1000 at least 0.002 higher than a weight average refractive index of the first polysiloxane and the first silane crosslinker, has a molecular weight from 100 to 700, preferably 150 to 500, preferably 180 to 400. Preferably, the first compound has a refractive index of at least 1.50, preferably at least 1.51, preferably at least 1.52; preferably no greater than 1.7, preferably no greater than 1.65. Preferably, the first compound has a refractive index at least 0.005 higher than a weight average refractive index of the first polysiloxane and the first silane crosslinker, preferably at least 0.01, preferably at least 0.015. Preferably, the first compound is a silicon-containing compound, preferably a silane compound. Preferably, the first compound comprises a $C_6$-$C_{20}$ aryl substituent, preferably $C_6$-$C_{15}$ aryl, preferably $C_6$-$C_{12}$ aryl, preferably phenyl. Preferably, the epoxy group is part of a $C_3$-$C_{20}$ alkyl group, preferably $C_4$-$C_{15}$ alkyl, preferably $C_4$-$C_{10}$ alkyl, preferably 2-(3,4-epoxycyclohexyl)ethyl. Preferably, the first compound is 2-(3,4-epoxycyclohexyl)ethyldimethylphenylsilane. Preferably, the first composition has a refractive index of at least 1.49, preferably at least 1.51, preferably at least 1.52; preferably no more than 1.7, preferably no more than 1.65.

Preferably, the first composition comprises from 50 to 90 wt % of first polysiloxane(s), preferably at least 55 wt %, preferably at least 60 wt %, preferably at least 65 wt %, preferably at least 70 wt %; preferably no more than 85 wt %, preferably no more than 78 wt %. Preferably, the first composition comprises from 2 to 15 wt % of silane crosslinker(s), preferably at least 3 wt %, preferably at least 4 wt %; preferably no more than 10 wt %, preferably no more than 7 wt %, preferably no more than 6 wt %. Preferably, the first composition comprises from 5 to 40 wt % of first compound(s), preferably at least 10 wt %, preferably at least 16 wt %; preferably no more than 30 wt %, preferably no more than 24 wt %.

Preferably, the first composition further comprises a hydrosilylation catalyst, preferably a platinum compound or complex, e.g., $H_2PtCl_6$, di-µ.-carbonyldi-.π.-cyclopentadienyldinickel, a platinum-carbonyl complex, a platinum-divinyltetramethyldisiloxane complex, a platinum cyclovinylmethylsiloxane complex and platinum acetylacetonate (acac). Other typical hydrosilylation catalysts include nickel and rhodium compounds, e.g., $Rh(acac)_2(CO)_2$ and $Ni(acac)_2$. Preferably, the hydrosilylation catalyst is present in the first composition in an amount from 0.1 to 25 ppm, preferably at least 0.5 ppm, preferably at least 1 ppm, preferably at least 2 ppm, preferably at least 3 ppm; preferably no more than 20 ppm, preferably no more than 15 ppm, preferably no more than 10 ppm, preferably no more than 8 ppm.

Preferably, the first composition further comprises an inhibitor for hydrosilylation reaction. Inhibitors for hydrosilylation are well known. The inhibitor provides sufficient for the first composition to be processed without gelation. Examples include 1,3 divinyldisiloxane, $(MeViSiO_{2/2})_4$, 2-methy-3-butynol, 1-ethynyl-1-cyclohexanol. Preferably, the inhibitor is $(MeViSiO_{2/2})_4$. Preferably, the first composition comprises from 0.5 ppm to 0.6% of inhibitor(s), preferably at least 1 ppm, preferably at least 2 ppm; preferably no more than 0.5%, preferably no more than 0.4%.

The second composition comprises: (i) a second polysiloxane comprising epoxy groups and alkenyl groups, (ii) a second silane crosslinker comprising at least two silicon-hydrogen bonds, (iii) at least one hydrosilylation catalyst, and (iv) at least one inhibitor for hydrosilylation. Preferably, the second polysiloxane comprising epoxy groups and alkenyl groups comprises from 4 to 25 mole % (preferably 6 to 22 mole %, preferably 8 to 20 mole %, preferably 10 to 19 mole %) of a unit having formula $R^9R^{10}R^{11}SiO_{1/2}$, wherein $R^9$ and $R^{10}$ independently are $C_1$-$C_{12}$ alkyl, preferably $C_1$-$C_6$ alkyl, preferably $C_1$-$C_4$ alkyl, preferably methyl or ethyl, preferably methyl; and $R^{11}$ is $C_2$-$C_{12}$ alkenyl, preferably $C_2$-$C_6$ alkenyl, preferably $C_2$-$C_4$ alkenyl, preferably vinyl. Preferably, the second polysiloxane comprises from 20 to 50 mole % (preferably 24 to 44 mole %, preferably 26 to 42 mole %, preferably 28 to 40 mole %) of a unit having formula $Ep^2SiO_{3/2}$, wherein $Ep^2$ is $C_3$-$C_{20}$ alkyl substituted with an epoxy group, preferably $C_4$-$C_{15}$ alkyl substituted with an epoxy group, preferably $C_5$-$C_{10}$ alkyl substituted with an epoxy group, preferably $C_5$-$C_{10}$ alkyl comprising cyclohexyl fused to an ethylene oxide ring, preferably 2-(3,4-epoxycyclohexyl)ethyl. Preferably, the second polysiloxane comprises from 35 to 65 mole % (preferably 38 to 62 mole %, preferably 41 to 59 mole %, preferably 43 to 57 mole %) of a unit having formula $R^{12}SiO_{3/2}$, wherein $R^{12}$ is $C_1$-$C_{18}$ alkyl, preferably $C_2$-$C_{12}$ alkyl, preferably $C_3$-$C_{10}$ alkyl, preferably $C_4$-$C_8$ alkyl, preferably hexyl. Preferably, the second silane crosslinker has three silicon-hydrogen bonds (preferably 4) and a molecular weight from 200 to 1000, preferably 300 to 600, preferably 300 to 500. Preferably, the silicon-hydrogen bonds connect to different silicon atoms. Preferably, the second silane crosslinker has formula $Si(OSiR_2H)_4$, where R is $C_1$-$C_6$ alkyl, preferably $C_1$-$C_4$ alkyl, preferably methyl or ethyl, preferably methyl.

Preferably, the second composition (preferably the same as the lower clad) comprises from 70 to 99 wt % of second polysiloxane(s), preferably at least 80 wt %, preferably at least 85 wt %, preferably at least 90 wt %; preferably no more than 97 wt %, preferably no more than 96 wt %, preferably no more than 95 wt %. Preferably, the second composition comprises from 1 to 30 wt % of second silane crosslinker(s), preferably at least 3 wt %, preferably at least 5 wt %; preferably no more than 20 wt %, preferably no more than 15 wt %, preferably no more than 10 wt %.

In steps (b) and (d), preferably heating is performed at a temperature of at least 30° C., preferably at least 50° C., preferably at least 100° C.; preferably no more than 180° C., preferably no more than 130° C. Preferably, the heating time is from 0.1 to 30 minutes, preferably 1 to 5 minutes. In step (f), heating the composite to evaporate at least part of the uncured portion of the first composition produces a final patterned core layer. In step (f), preferably the heating is performed at a temperature of at least 80° C., preferably at least 120° C.; preferably no more than 250° C., preferably no more than 150° C. Preferably, the heating time is from 10 seconds to 10 hours, preferably at least 30 seconds; preferably no more than 5 hours, preferably no more than 1 hour, preferably no more than 10 minutes.

Preferably, curing via ultraviolet light is performed at a wavelength from 180 nm to 450 nm, preferably 300 to 400 nm. Preferably, the dose level is from 5 to 3000 mJ/cm$^2$, preferably from 50 to 2000 mJ/cm$^2$, preferably from 800 to 1800 mJ/cm$^2$. Preferably, a photo acid generator is present in the composition to be cured. Photo acid generators are well known, see, e.g., EP1142928. Examples of classes of photo acid generators are onium salts, diazoketones, sulfones and sulfonates. Onium salts include iodonium salts, sulfonium salts, phosphonium salts, diazonium salts and pyridinium salts. Especially preferred photo acid generators include triarylsulfonium salts of sulfonic acids, diaryliodonium salts of perfluoroalkylsulfonic acids, diaryliodonium salts of sulfonic acids, diaryliodonium salts of boronic acids and triarylsulfonium salts of boronic acids.

Preferably, the thickness of the lower clad layer is from 50 to 200 microns, preferably 100 to 200 microns. Preferably, the thickness of the core layer (cured first composition) is from 40 to 70 microns, preferably 45 to 55 microns.

The compositions of this invention may include optional ingredients such as photosensitizers, fillers, high release additives, reactive diluents, photochromic materials, dyes, colorants, preservatives, and other radiation curable compounds.

EXAMPLES

Example 1: Clad Formulation

Clad: 120 g of epoxy functional resin with a formulation of (n-hexylSiO$_{3/2}$)$_{0.507}$(EpSiO$_{3/2}$)$_{0.338}$(Me$_2$ViSiO$_{1/2}$)$_{0.154}$ was mixed with 8.13 g of Si(OSiMe$_2$H)$_4$ to produce a mixture with SiH/Vi ratio of 0.74. A sample of 0.44 g (MeViSiO$_{2/2}$)$_4$ was added and mixed well using a Vortex mixer, followed by addition of 0.7 g of Karstedt's catalyst that is diluted to 0.16% Pt with toluene. The composition corresponds to 92.8% epoxy resin, 6.29% crosslinker, 0.34% inhibitor and 8.66 ppm platinum catalyst. The solution was mixed again using a Vortex mixer. The mixture has a refractive index (RI) of 1.4691 and a viscosity of 2700 cPs at 25° C. The mixture was spun coated on a silicon wafer at 4000 rpm for 60 seconds, the film was thermally cured at 100° C. for 1 minute on a hot plate. The film has a refractive index of 1.4759. After heating at 130° C. and 180° C. for 1 hour, the refractive index of the films were 1.4763 and 1.4767 (measured using Metricon prism coupler at 632.8 nm), respectively.

Example 2: Core Formulation

Core: A sample of 32 g of clad formulation described in Example 1 was mixed with 8.05 g of 2-(3,4-epoxycyclohexyl)ethyl dimethylphenylsilane and 0.104 g of CPI 300 catalyst (sulfonium salt from Nagase Corp.). The core composition corresponds to 74.3% epoxy resin, 5.03% crosslinker, 0.28% inhibitor, 6.8 ppm platinum catalyst, 20.13% 2-(3,4-epoxycyclohexyl)ethyl dimethylphenylsilane and 0.25% CPI 300 catalyst. The material was filtered through 1 micron meter filter. The mixture has a RI of 1.4804 and a viscosity of 440 cPs at 25° C. The mixture was spun coated on a silicon wafer at 600 rpm for 20 seconds, and film was thermally cured at 100° C. for 2 minute on a hot plate. The film has a refractive index of 1.4862. The films were then exposed to UV (300 mJ/cm$^2$), the refractive index increased to 1.4921. The thermal cured and thermal/UV cured films were then heated at 130° C. and 180° C. for 1 hour, respectively. The refractive indices are given in Table 1.

TABLE 1

Refractive Indices for Film processed at Various Conditions

| | Cure Condition | RI after Cure | RI, 130° C., 1 h | RI, 180° C., 1 h |
|---|---|---|---|---|
| Sample 1 | 100° C., 2 minutes | 1.4862 | 1.4752 | 1.4908 |
| Sample 2 | 100° C., 2 minutes UV 300 mJ/cm$^2$ | 1.4921 | 1.4903 | 1.4909 |

Example 3: Process to Make Waveguide and Properties

The clad of Example 1 was spun down at 1900 rpm on silicon wafer for 25 seconds and cured on a hot plate at 100° C. for 1 minute. The core of Example 2 was spun down at 600 RPM for 20 seconds on the bottom clad and cured at 100° C. for 2 minutes. The top clad (Example 1) was then spun onto the core at 1900 rpm on silicon wafer for 25 seconds and cured on a hot plate at 100° C. for 1 minute. The stack of films was photo patterned using an 8 inch photo mask with a 100 micron proximity gap. 400 mJ/cm$^2$ dose was used to achieve desired waveguide feature. The patterned waveguide stack was then placed in a 130° C. oven for 1 hours.

OIC Run Sheet
Date: 15 Jun. 2016
Operator/s BS

| Spin ID | Materials Bottom Clad Core Top Clad | | Spin Time | Substrate/s | | UV dose | | Bake Time | |
|---|---|---|---|---|---|---|---|---|---|
| Step | RPM | RPM/s | (sec) | Material | Si | (mJ/cm$^2$) | T (° C.) | (min) | comments |
| Bottom Clad planarize | 1900 | 500 | 25 | | | | | | |
| Bake-HP | | | | | | | 100 | 1 | |
| Core planarize | 600 | 500 | 20 | | | | | | |
| Bake-HP | | | | | | | 100 | 2 | |

OIC Run Sheet
Date: 15 Jun. 2016
Operator/s BS

| Spin ID | Materials Bottom Clad Core Top Clad | | Spin Time | Substrate/s | | UV dose | | Bake Time | |
|---|---|---|---|---|---|---|---|---|---|
| Step | RPM | RPM/s | (sec) | Material | Si | (mJ/cm$^2$) | T (° C.) | (min) | comments |
| Clad planarize Bake-HP | 1900 | 500 | 25 | | | | 100 | 1 | |
| Exposure | | Flood/pattern | (F/P) | P | Power (J/cm$^2$) | 400 | | | 100 μm gap spiral mask |
| Oven Bake | | | | | | | 130 C. | 60 | |

After final curing, the waveguide stack was diced and cross section imaged using phase contrast transmission microscopy, which showed the waveguide structures. Single Mode (SM) underfill insertion loss measurements of a single 16.25 cm channel at 850 nm yielded an insertion loss of 4.47 dB and a projected propagation loss of 0.275 dB/cm.

The invention claimed is:

1. A method for producing an optical waveguide; said method comprising steps of:
    (a) depositing on a substrate a first composition comprising: (i) a first polysiloxane comprising epoxy groups and alkenyl groups, (ii) a first silane crosslinker comprising at least two silicon-hydrogen bonds, (iii) at least one first compound comprising an epoxy group, having molecular weight no greater than 1000 and a refractive index at least 0.002 higher than a weight average refractive index of the first polysiloxane and the first silane crosslinker, (iv) at least one hydrosilylation catalyst, (v) at least one inhibitor for hydrosilylation, and (vi) at least one photo acid generator;
    (b) heating to produce a cured first composition;
    (c) depositing on the cured first composition a second composition comprising: (i) a second polysiloxane comprising epoxy groups and alkenyl groups, (ii) a second silane crosslinker comprising at least two silicon-hydrogen bonds, (iii) at least one hydrosilylation catalyst, and (iv) at least one inhibitor for hydrosilylation, to produce a composite;
    (d) curing the second composition by heating to produce a composite;
    (e) exposing the composite to ultraviolet light through a mask to produce a patterned core layer comprising a cured portion of the first composition and an uncured portion of the first composition; and
    (f) heating to evaporate at least a part of the uncured portion of the first composition to produce a final patterned core layer.

2. The method of claim 1 in which the first compound has a molecular weight from 100 to 600.

3. The method of claim 2 in which the first compound has a refractive index at least 0.005 higher than a weight average refractive index of the first polysiloxane and the first silane crosslinker.

4. The method of claim 3 in which the first composition comprises from 50 to 90 wt % of at least one first polysiloxane, from 2 to 15 wt % of at least one silane crosslinker having at least 2 silicon-hydrogen bonds, and from 5 to 40 wt % of first compound.

5. The method of claim 4 in which the second composition comprises from 70 to 99 wt % of at least one second polysiloxane and from 1 to 30 wt % of at least one second silane crosslinker.

6. The method of claim 5 in which the first compound comprises a $C_6$-$C_{20}$ aryl substituent.

7. The method of claim 6 in which the first polysiloxane comprising epoxy groups and alkenyl groups comprises from 4 to 25 mole % of a unit having formula $R^5R^6R^7SiO_{1/2}$, wherein $R^5$ and $R^6$ independently are $C_1$-$C_{12}$ alkyl and $R^7$ is $C_2$-$C_{12}$ alkenyl; from 20 to 50 mole % of a unit having formula $Ep^1SiO_{3/2}$, wherein $Ep^1$ is $C_3$-$C_{20}$ alkyl substituted with an epoxy group; and from 35 to 65 mole % of a unit having formula $R^8SiO_{3/2}$, wherein $R^8$ is $C_1$-$C_{18}$ alkyl.

8. The method of claim 7 in which the second polysiloxane comprising epoxy groups and alkenyl groups comprises from 4 to 25 mole % of a unit having formula $R^9R^{10}R^{11}SiO_{1/2}$, wherein $R^9$ and $R^{10}$ independently are $C_1$-$C_{12}$ alkyl and $R^{11}$ is $C_2$-$C_{12}$ alkenyl; from 20 to 50 mole % of a unit having formula $Ep^2SiO_{3/2}$, wherein $Ep^2$ is $C_3$-$C_{20}$ alkyl substituted with an epoxy group; and from 35 to 65 mole % of a unit having formula $R^{12}SiO_{3/2}$, wherein $R^{12}$ is $C_1$-$C_{18}$ alkyl.

9. The method of claim 8 in which each of the first and second silane crosslinkers has formula $Si(OSiR_2H)_4$, where R is $C_1$-$C_4$ alkyl.

10. The method of claim 9 in which $R^7$ and $R^{11}$ are vinyl; $R^5$, $R^6$, $R^9$ and $R^{10}$ independently are $C_1$-$C_4$ alkyl; $R^8$ and $R^{12}$ independently are $C_4$-$C_8$ alkyl; and $Ep^1$ and $Ep^2$ are $C_5$-$C_{10}$ alkyl comprising cyclohexyl fused to an ethylene oxide ring.

* * * * *